United States Patent [19]

Fujihara et al.

[11] Patent Number: 5,410,259
[45] Date of Patent: Apr. 25, 1995

[54] PROBING DEVICE SETTING A PROBE CARD PARALLEL

[75] Inventors: Hitoshi Fujihara; Itaru Takao, both of Yamanashi, Japan

[73] Assignees: Tokyo Electron Yamanashi Limited, Nirasaki; Tokyo Electron Limited, Tokyo, both of Japan

[21] Appl. No.: 69,839

[22] Filed: Jun. 1, 1993

[30] Foreign Application Priority Data

Jun. 1, 1992 [JP] Japan ............... 4-140563

[51] Int. Cl.⁶ .............................................. G01R 1/04
[52] U.S. Cl. .................................................. 324/758
[58] Field of Search ............... 33/DIG. 13, 568, 1 M;
324/758, 158 R, 158 P, 158 F; 269/44, 900;
248/901; 358/106; 356/400–401

[56] References Cited

U.S. PATENT DOCUMENTS

| | | | |
|---|---|---|---|
| 4,786,867 | 11/1988 | Yamatsu | 324/158 F |
| 4,864,227 | 9/1989 | Sato | 324/158 F |
| 5,233,291 | 8/1993 | Kouno et al. | 324/158 R |

FOREIGN PATENT DOCUMENTS

58-30128 2/1983 Japan.

Primary Examiner—Kenneth A. Wieder
Assistant Examiner—Barry C. Bowser
Attorney, Agent, or Firm—Oblon, Spivak, McClelland, Maier & Neustadt

[57] ABSTRACT

A probe apparatus comprises a test head for electrically testing a chip of a semiconductor wafer, a probe card having a plurality of probe needles electrically connected to the test head, a table plate for supporting the semiconductor wafer such that the semiconductor wafer faces the probe card, a CCD camera for detecting heights at predetermined two pairs of points on the probe card and outputting signals corresponding to the heights, and three leg members for driving the table plate such that the semiconductor wafer supported by the table plate is parallel to the probe card, on the basis of distances between the two pairs of points in X- and Y-directions which are obtained from X- and Y-directional movement amounts of the table plate.

16 Claims, 5 Drawing Sheets

PROBING DEVICE SETTING A PROBE CARD PARALLEL

BACKGROUND OF THE INVENTION

1. Field of the Invention

The present invention relates to a probing device for measuring electrical characteristics of a test object such as a semiconductor wafer.

2. Description of the Related Art

A plurality of chips are arranged on an object, e.g., the surface of an object at regular intervals. A plurality of pads are formed at predetermined locations within the area of each chip, the pads being connected to various signal lines within the chip. The electrical characteristics of the chip are measured by putting probe needles of a testing apparatus in contact with the corresponding pads of the chip. A defective chip, if any, is identified by marking, etc. In general, the testing apparatus of this type is combined with a probe apparatus for achieving an automatic test operation.

Figure 1:
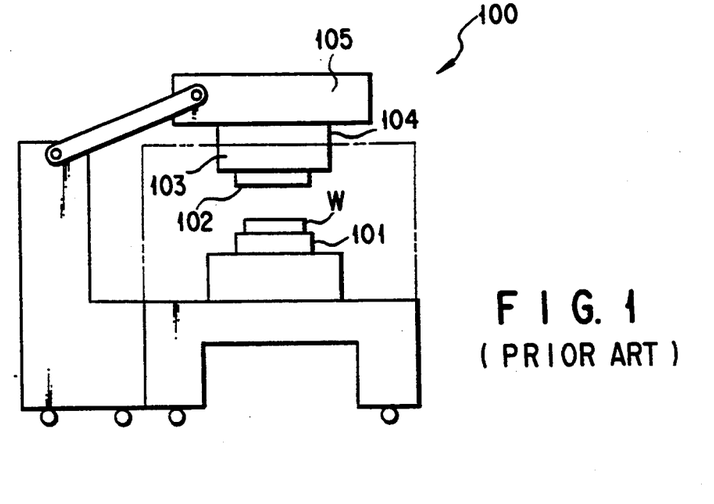
FIG. 1 is a view for schematically showing a conventional probe apparatus.

In a probe apparatus 100, as shown in FIG. 1, a probe card 102 having probe needles arranged in accordance with the array of electrode pads of an IC chip in a wafer is situated above a wafer table 101 which is movable in X-, Y-, Z- and θ-directions. The probe card 102 is fixed on the lower surface of a contact ring 103 by means of, e.g. screws. The contact ring 103 is electrically connected to the probe card 102 via measuring cables or pogo pins of the contact ring 103. Further, the contact ring 103 is fixed to an insert ring 104 of the probe apparatus body by fixing means (not shown). When a probe test is performed by this probe apparatus, a test head 105 is pressed on the upper surface of the contact ring 103 such that the test head 105 is electrically connected to the contact ring 103 via the measuring cables or pogo pins. The wafer table 101 is raised to bring the probe needles into contact with the electrode pads of the chip in the wafer. In this state, electrical measurement is conducted to judge the condition of the IC chip.

Besides, recently, a multi-probe method is performed to enhance the testing efficiency. Specifically, a plurality of IC chips (e.g. 16 IC chips) are measured at a time by a probe card having probe needles corresponding to these IC chips.

In the conventional probe apparatus, however, a plurality of connection parts, such as measuring cables or pogo pins, are interposed between the IC chip to be tested and the test head, resulting in an increase in capacitance and impedance. Consequently, a high-frequency examination at 200-300 MHz or above cannot exactly be performed. In addition, it is difficult to achieve matching between the IC chip and the test head 105, and stable measurement is not surely performed.

Under the circumstances, it is thought that the probe card is directly fixed to the test head and thereby the number of connection parts is reduced to a minimum. In general, however, the test head and the probe apparatus body are mounted on separate bases, and the horizontal positions thereof are not identical. Thus, if the probe card is directly connected to the test head, the probe needles do not come into perfect contact with the IC chip even if the needles are aligned. Therefore, the horizontal plane of the probe card must be adjusted to coincide with the horizontal plane of the wafer.

In the case of the conventional probe apparatus, too, levelness adjustment is performed for the surface on which the probe card is attached and the wafer table in the process of assembling the apparatus. For example, a single probe for measuring a single chip requires a levelness of several-ten microns, and a multi-probe for measuring two or more chips at time requires an about twice higher levelness than the single probe. The weight of the test head, however, is 200 kg or more. In particular, the weight of a test head for a large-diameter wafer with high integration density is 300 to 500 kg. Furthermore, the test head is not supported by support means with high rigidity. Thus, vibration may result in misalignment. Even if high-precision level adjustment is performed at the time of assembly, desired precision may not be obtained at the time of measurement.

Figure 2:
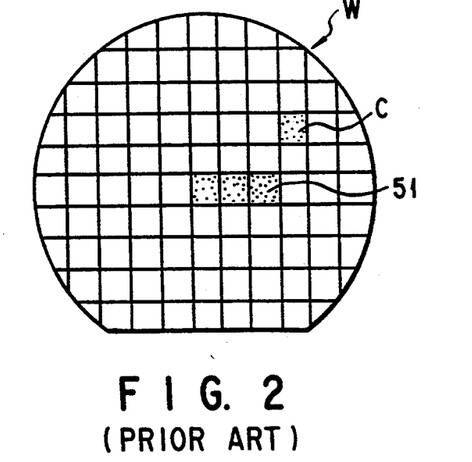
FIG. 2 is a plan view of a silicon wafer having a large-sized chip.
Figure 3:
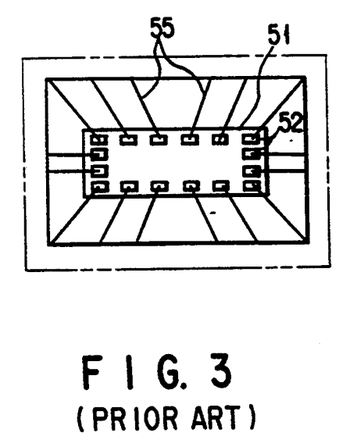
FIG. 3 is an enlarged plan view of the large-sized chip shown in FIG. 2 and probe needles.
Figure 4:
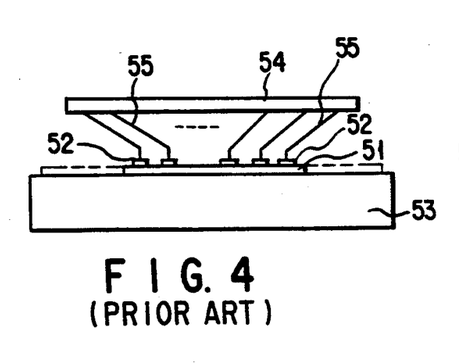
FIG. 4 is a side view showing large-sized chips and a probe card.
Figure 5:
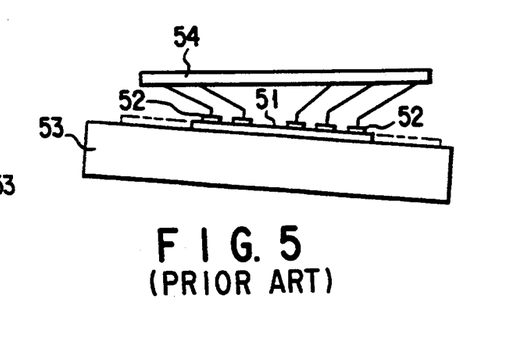
FIG. 5 is a side view showing large-sized chips and a probe card in the state in which, unlike FIG. 4, the chips are not parallel to the probe card.

On the other hand, with an increase in size of a chip due to recent development of VLSI semiconductor devices, a large-size rectangular chip 51 corresponding to three consecutive chips C is formed on a silicon wafer W, as shown in FIG. 2. The chip 51 has many pads 52 for connection with bonding wires (not shown), as shown in FIG. 3. When the good/bad condition of the chip 51 is checked, the tips of needles 55 of a probe card 54 are placed under pressure on the surfaces to be tested of the pads 52 of the chip 51 placed on a table 53 having a flat upper surface, as shown in FIG. 4. Test signals are applied to the chip 51 from a circuit tester (not shown), and thereby it is checked whether the circuit construction of the chip 51 meets the design specifications. As is clear from FIG. 3, the tips of needles 55 are placed under pressure on the pads 52. However, as shown in FIG. 5, for example, in the case where the chip 51 is not parallel to the needle tips of the probe card 54, contact pressures of the right-side needle tips and left-side needle tips on the pads 52 are unbalanced. If the test signals are applied to the chip 51 from the circuit tester in this state, such test signals are not uniformly applied and the condition of the chip 51 may be misjudged.

SUMMARY OF THE INVENTION

The object of the present invention is to provide a probe apparatus capable of easily aligning an object to be processed with respect to a test head at the time of measurement, that is, capable of easily positioning a probe card and the object in parallel to each other.

DETAILED DESCRIPTION OF THE PREFERRED EMBODIMENTS

A probe apparatus according to a first embodiment of the present invention will now be described with reference to FIG. 6 to FIGS. 10A and 10B.

Figure 6:
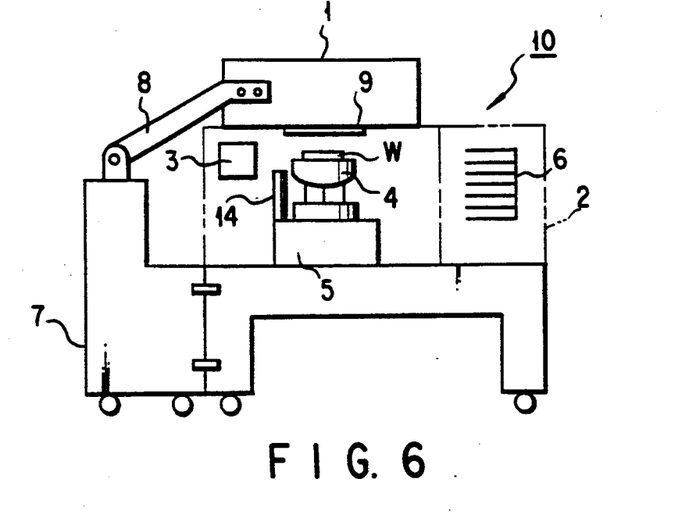
FIG. 6 schematically shows the entire structure of a probe apparatus according to an embodiment of the present invention.

FIG. 6 shows the entire structure of the probe apparatus of the invention. The probe apparatus mainly comprises a probe apparatus body 10 and a test head 1 supported by a support table 7 separately from the body 10. The probe apparatus body 10 comprises a loader-/unloader unit 2 for loading and unloading semiconductor wafers W, which loader/unloader unit 2 includes a cassette 6 for storing the semiconductor wafers W as objects to be tested, an alignment unit 3 having pattern recognition means such as an optical system or an ITV camera for correcting the $\theta$ axis and XY axes so that the scribe lines of the wafer have predetermined precision, and a prober unit having a wafer chuck 4 serving as wafer support means and a stage 5 comprising an X-stage and a Y-stage for moving the wafer chuck 4 in XY directions. A transfer arm (not shown) is provided between the loader/unloader unit 2 and the prober unit for transferring wafers W between the cassette 6 in which the wafers W are stored and the wafer chuck 4 of the prober unit. In addition, the probe apparatus comprises an operation panel (not shown), a microscope for monitoring the contact between the wafer W and the probe needles by the naked eye, a microcomputer for performing predetermined calculations on the basis of input data on measurement conditions supplied from the operation panel and data such as alignment data at the time of measurement and thereby delivering control signals to the driving units such as the stage, etc.

The test head 1 includes a power supply circuit for applying a predetermined voltage to predetermined pads of the IC chip formed on the wafer. The test head 1 is fixed on a support arm 8 pivotally attached to the support table 7. The test head 1 is movable from the retreat position at the non-measurement time to the measurement position above the apparatus body, as shown in FIG. 6. In order to support the weight of the test head 1, a clamp or the like for supporting one end portion of the test head 1 may be provided on the probe apparatus body. The test head 1 is provided with cooling means (not shown) for preventing the test head 1 from being heated by voltage application at the measurement time. Since a cooling fan which has conventionally been employed as cooling means causes vibration, it is desirable to use cooling means which circulates a coolant such as air, water, liquid nitrogen, or olefin.

Figure 7:
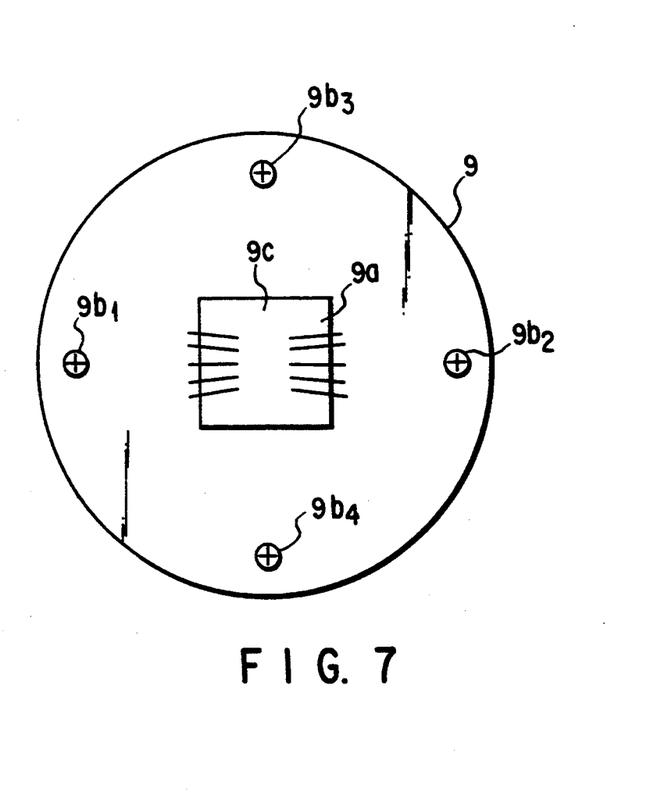
FIG. 7 is an enlarged bottom view of a probe card shown in FIG. 6.

A probe card 9 on which a predetermined conductor pattern is formed is directly fixed on that surface of the test head 1, which faces the apparatus body at the measurement position, by means of screws, etc. As is shown in FIG. 2, the probe card 9 has a plurality of probe needles 9a which are electrically connected to the conductor pattern and project from a center opening 9c. These probe needles 9a are provided to correspond to the test object. For example, in the case of single chip measurement, the number and arrangement of the probe needles correspond to the number of arrangement of the pads of the single chip. In the case of a multi-probe, the number and arrangement of the probe needles correspond to the number and arrangement of the pads of each chip. Levelness adjustment is performed in advance to make a plane defined by the tips of all probe needles 9a projecting from the opening 9c (i.e. a horizontal plane at which all the tips are located) parallel to the lower surface of the probe card 9 (opposed to the wafer). In addition, the lower surface of the probe card is provided with a plurality of target marks for detection of a inclination by correction means of the probe unit (described later). For example, the target marks are provided at four corners of the probe card 9: two marks ($9b_1$, $9b_2$) at a predetermined distance along the X-axis, and two marks ($9b_3$, $9b_4$) at a predetermined distance along the Y-axis. These target marks are colored so as to be distinguished from the peripheral areas by a CCD camera 14 (described later).

It is desirable that the probe apparatus body 10 and the test head 1 be mounted on vibration-proof bases, in order to prevent a variation in contact resistance between the probe needles 9a and the pads of the chip which result from vibration due to the movement of the stage.

Figure 8:
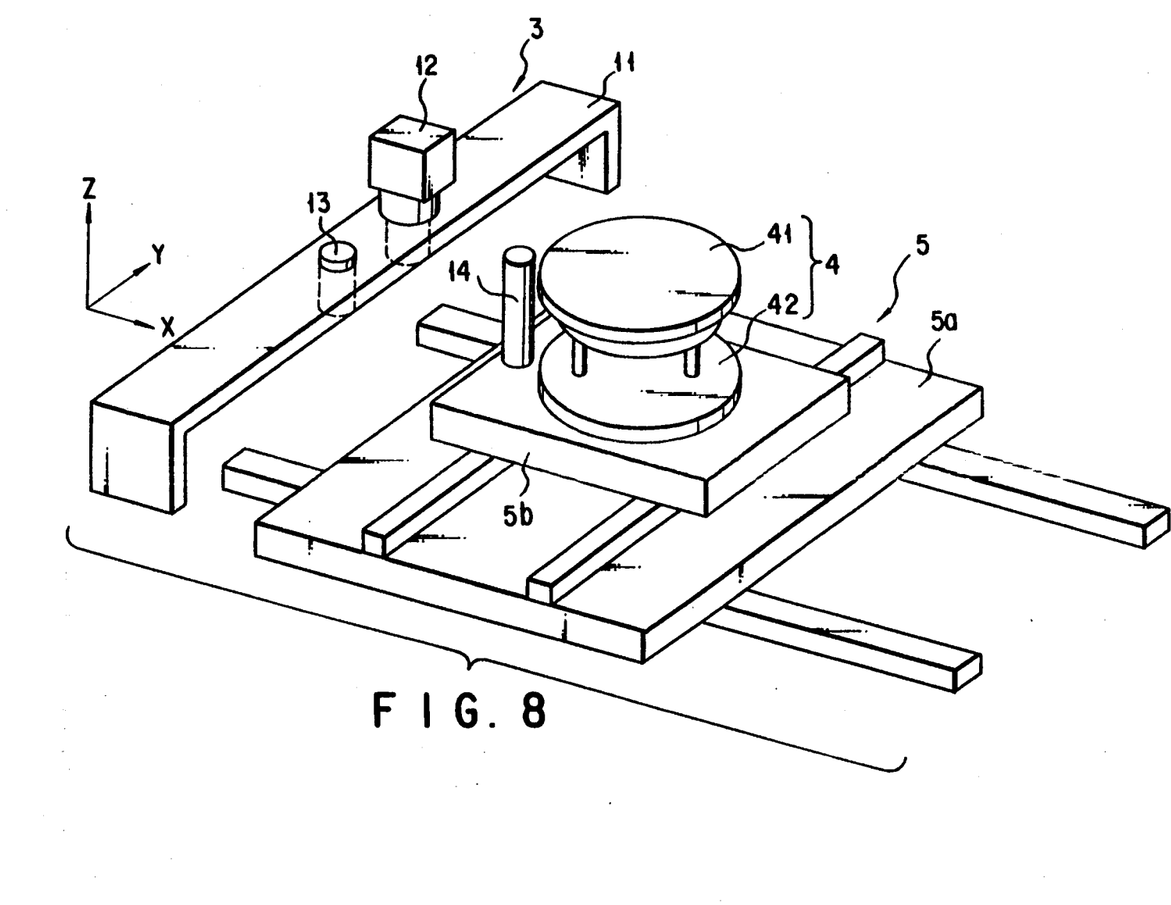
FIG. 8 is a perspective view showing an alignment unit and a stage.

As is shown in FIG. 8, the alignment unit 3 comprises an alignment bridge 11, an ITV camera 12 mounted on the bridge 11 to detect the position of a chip formed on a wafer which is located or passed below the camera 12, and a capacitance type sensor 13 for detecting the height of the wafer surface, etc. The stage 5 comprises an X-stage 5a movable in the X-direction along two guide rails extending in the X-direction and a Y-stage 5b movable in the Y-direction along two guide rails formed on the X-stage 5a. The X-stage 5a and Y-stage 5b are freely moved in horizontal planes in the X- and Y-directions by a drive mechanism 46 including a pulse motor.

Figure 9:
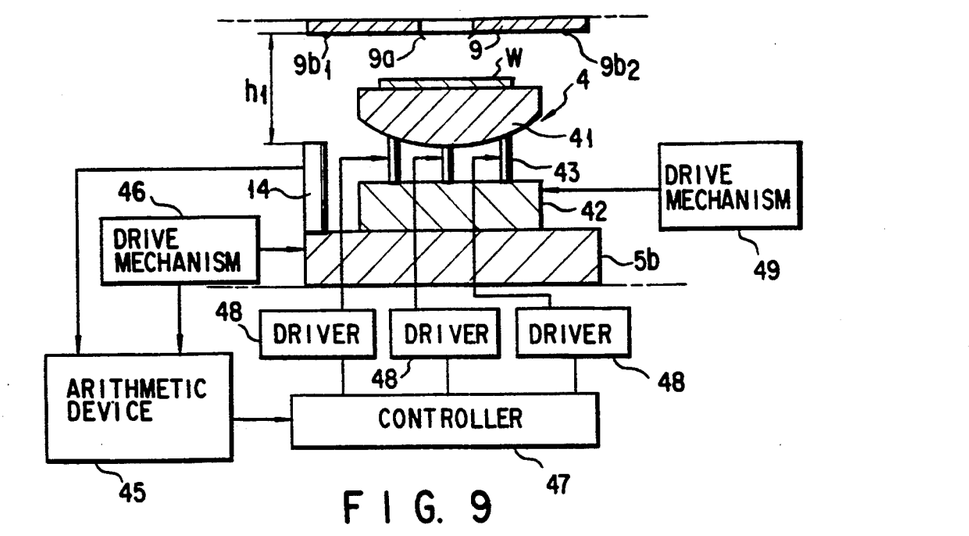
FIG. 9 illustrates a control system of the probe apparatus shown in FIG. 6.

The wafer chuck 4 comprises, as shown in FIG. 9, a table plate 41 for adsorbing the wafer W on its upper surface by means of, e.g. a vacuum suction mechanism, a movable unit 42, which is fixed on the Y-stage 5b, vertical movable in the Z-direction by means of a conventional elevation mechanism and rotatable about its rotational axis in parallel to the Z-axis by means of a conventional rotating mechanism (the rotating mechanism and the elevation mechanism are shown as drive mechanism 49), and a support unit 43 for coupling the table plate 41 and movable unit 42. The support unit supports a spherical bottom surface of the table plate 41 at a plurality of points, e.g. three apices (a, b, and c in FIG. 10B) of an equilateral triangle by means of support legs such as ball screws, piezoelectric elements, cams or air cylinders, which can vary their own support lengths individually. If the support unit 43 comprises three ball screws, the ball screws are individually rotated by drivers 48 such as stepping motors on the basis of signals from a controller 47. Thus, the distances (i.e. support lengths) between the table plate 41 and movable unit 42 are varied at points where the plate 41 is supported by the ball screws, thereby varying the angle of the table plate 41 with respect to a horizontal plane. If the support unit 43 comprises three piezoelectric elements, the magnitudes of voltages applied to the piezoelectric elements from the drivers 48 constituted by voltage sources are varied, thereby varying the support length at each support point. Thus, the angle of the upper surface of the table plate 41 is varied. As means for varying the angle as described above, there can be used cams, air-cylinders, or dovetail means in which a projecting portion is slidably fitted in a tapered recess portion.

A capacitance sensor (height sensor) or a CCD camera 14 for detecting the distance in the height direction between itself and the target marks of the probe card 9 and thereby detecting the inclination of the wafer chuck 4 with respect to the probe card 9 is fixed on the Y-stage 5b. In the case of the CCD camera 14, for example, the height $h_1$ from the camera 14 to the target marks is detected on the basis of the auto-focus adjustment amount of the camera, which will be described below. The height of the CCD camera 14 is set by the alignment unit 3.

The operation of the above probe apparatus will now be described.

The wafer W is transferred by the transfer arm from the loader unit 2 onto the table plate 41 of the wafer chuck 4. Then, the wafer chuck 4 is moved to the alignment bridge 11 by the XY stage 5, and the position of the chip formed on the wafer is detected by the ITV camera 12 according to a conventional method. The X- and Y-axes are adjusted such that the orthogonality between the X- and Y-axes and the scrub lines falls within a predetermined range of precision and the probe needles 9a and the pads of the chip coincide on the basis of predetermined parameters.

Next, the stage 5 is moved and the CCD camera 14 detects successively the height of each of the target marks $9b_1$ and $9b_2$ located at both ends in the X-direction of the probe card 9. The height $h_1$ is calculated as distance $l_1$ between the camera focus and the target mark $9b_1$, $9b_2$, on the basis of the auto-focus adjustment amount obtained when the visibility of images of target marks $9b_1$ and $9b_2$ in the CCD camera 14 are enhanced to a maximum by a built-in microcomputer. The heights $h_1$ and $h_2$ at two points corresponding to the X-directional two target marks $9b_1$ and $9b_2$ are obtained, and then the X-directional distance $d_1$ between the two points is calculated as a movement amount between the initial position of the CCD camera 14 (i.e. the position corresponding to the target mark $9b_1$) and the position corresponding to the target mark $9b_2$. The inclination $\theta_1$ in the X-direction can be found from the heights $h_1$ and $h_2$ and the distance $d_1$, on the basis of the following equation:

$$\tan\theta_1 = (h_2 - h_1)/d_1$$

Figure 10A:
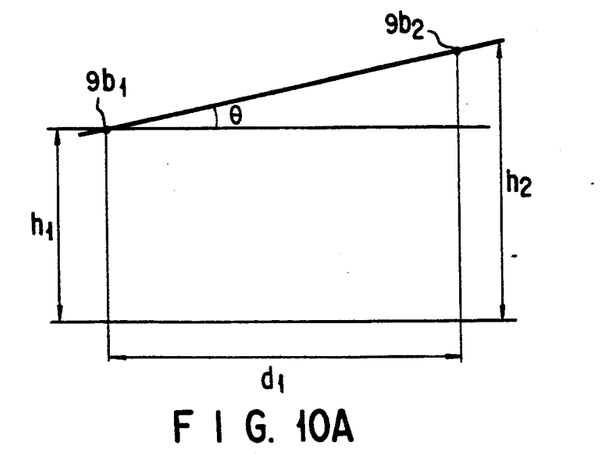
FIGS. 10A and 10B are views for explaining the operation of the probe apparatus of the embodiment, FIG. 10A showing the relationship between the height for calculating an inclination $\theta$ of the probe card, and FIG. 10B showing support points on a support table.

(see FIG. 10A). Similarly, the heights $h_3$ and $h_4$ at two points corresponding to the two target marks $9b_3$ and $9b_4$ located at both ends in the Y-direction of the probe card are calculated and the inclination $\theta$ in the Y-direction is found from the Y-directional distance $d_2$ between the two points on the basis of the following equation:

$$\tan\theta_2 = (h_2 - h_1)/d_1$$

These calculations are performed by an arithmetic device 45 on the basis of output signals (movement amount signals or distance signals) from the drive mechanism 46 for driving the X- and Y-stages 5a and 5b and output signals (height signals) from the CCD camera 14. The calculation obtained in this case is a relative inclination of the probe card 9 with respect to the Y-stage 5b, i.e. table plate 41. Either the probe card 9 or table plate 41 may be horizontal, or both may not be horizontal.

Figure 10B:
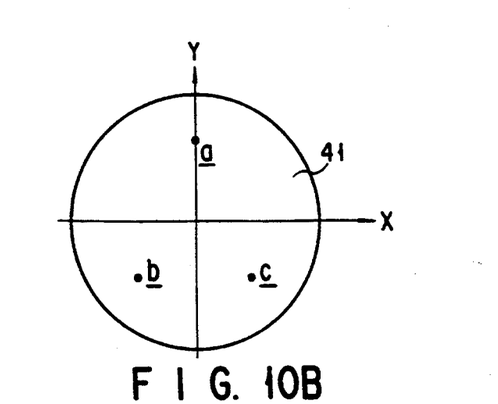

In order to make the inclination of the table plate 41 coincide with the inclination of the probe card 9 calculated by the arithmetic device 45, the controller 47 controls the drivers 45 on the basis of the calculated values. The drivers 45 drive the ball screws or piezoelectric elements of the support unit 43, thereby varying the support lengths at the respective support points. Suppose that the (three) support points a, b and c are symmetric with respect to the Y-axis, as shown in FIG. 10B. When the table plate 41 is inclined along the Y-axis, the support length at the support point a on the Y-axis is varied or the support lengths at the other support points b and c are varied simultaneously by the same degree. When the table plate 41 is inclined along the Y-axis, the support length at the support point b or c is varied by a predetermined degree and the support length at the support point a is varied half the predetermined degree. Thereby, the table plate 41 is kept in parallel to the probe card 9, and the plane defined by the probe needles 9a becomes parallel to the plane of the wafer. The ball screws or piezoelectric elements of the support unit 43 may be moved independently in the X-direction and Y-direction. However, it is possible to prepare a table showing movement amounts at the three points with respect to the X- and Y-directional inclinations and store the table in a memory of the microcomputer. Based on the table, the inclination of the table plate 41 may be varied by a single operation of the support unit 43.

After the parallelism between the table plate 41 and probe card 9 is established, the stage 5 is moved according to a conventional method and the wafer chuck 4 is moved to the alignment bridge 11 once again. Further, the height of the wafer surface is detected by the capacitance type sensor 13, and the movement amount in the Z-direction of the card is determined to bring the chip into contact with the probe needles 9a at an optimal pressure. In addition, the X- and Y-directional movement amounts varied due to the inclination are corrected.

Thereafter, the stage 5 is moved and the wafer chuck 4 is moved to the probe unit. The table plate 41 is raised to make the wafer closer to the probe needles 9a. While observing by means of a microscope or TV camera, X-, Y-, Z- and $\theta$-directional alignment between the pads of the chip and the probe needles 9a is performed. Thereafter, the probe needles 9a are brought into contact with the pads. Then, by means of a tester connected to the test head 1, a single chip or plural chips are simultaneously subjected to electrical measurement, and the good/bad condition of the chip(s) is judged.

In the above embodiment, the surface on which the test object is placed and the probe card are situated horizontally ("horizontal prober"). The present invention, however, is applicable to a vertical probe apparatus wherein the test object is held vertically and the object is moved and approached to the test head 1 horizontally. In the vertical probe apparatus, the test head having a large size and heavy weight is fixed and the object-size unit is moved. This vertical probe apparatus is advantageous in that contact between the probe needles and the pads due to unstable supporting of the test head can be prevented. In this case, too, the probe card may be directly fixed on the test head, and thereby contact portions such as measuring cables can be dispensed with. Thus, a stable test can be performed.

The above embodiment is directed to the use of semiconductor wafers as test objects. Needless to say, the present invention is applicable to LCD glass substrates, etc.

As is clear from the above description, according to the probe apparatus of the present invention, the inclination of the test object with respect to the probe card can be corrected. Accordingly, it is possible to prevent defective contact between the object and the probe card due to a difference in inclination between the object and the probe card resulting from an assembly error, and exact measurement can be performed. By providing the correction means, the probe card can be directly attached to the test head. Thus, connection portions such as measuring cables are not required between the test head and the probe card, and an increase in impedance can be prevented. Therefore, exact high-frequency measurement can be performed.

A second embodiment of the invention will now be described with reference to FIGS. 11A, 11B and 12. The parts already described with reference to FIGS. 2 to 4 are denoted by like reference numerals, and descriptions thereof are omitted.

Figure 11A:
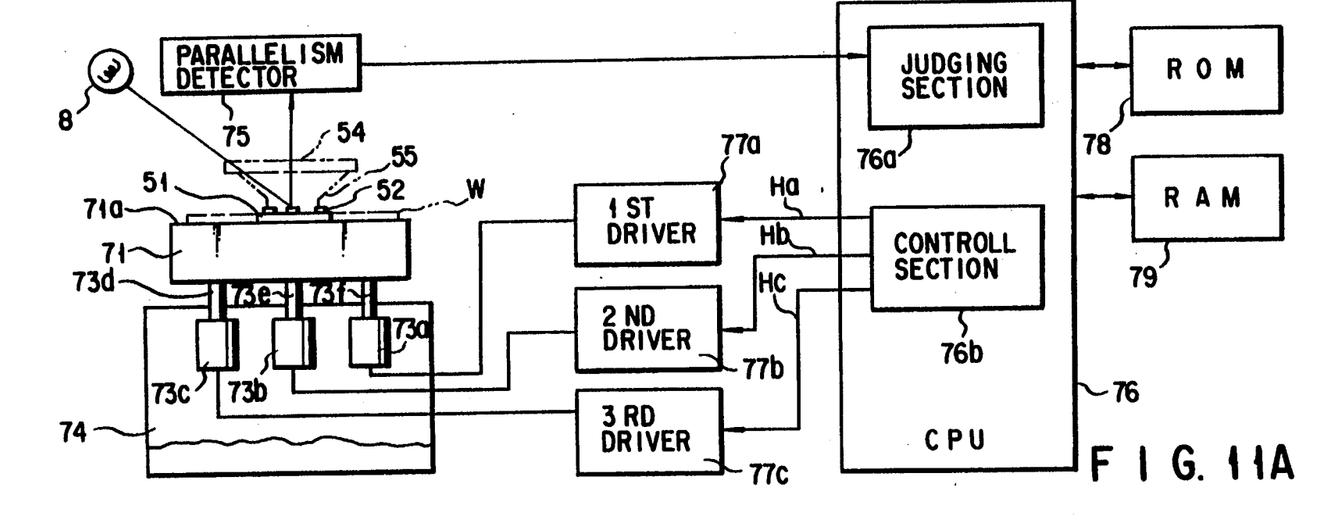
FIGS. 11A and 11B show a probe apparatus according to a second embodiment of the invention, FIG. 11A showing schematically the entire structure thereof, and FIG. 11B showing support points on the support table.
Figure 11B:
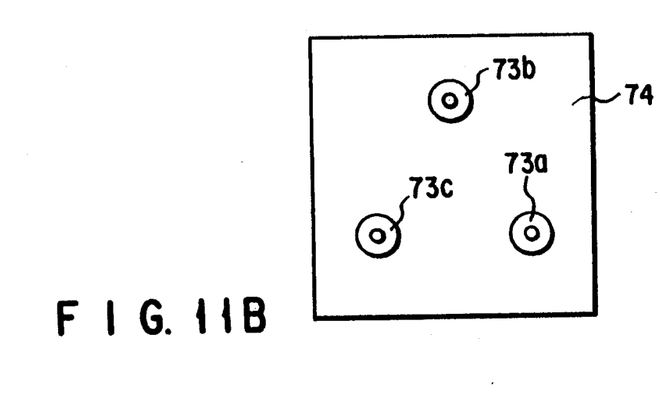
Figure 12:
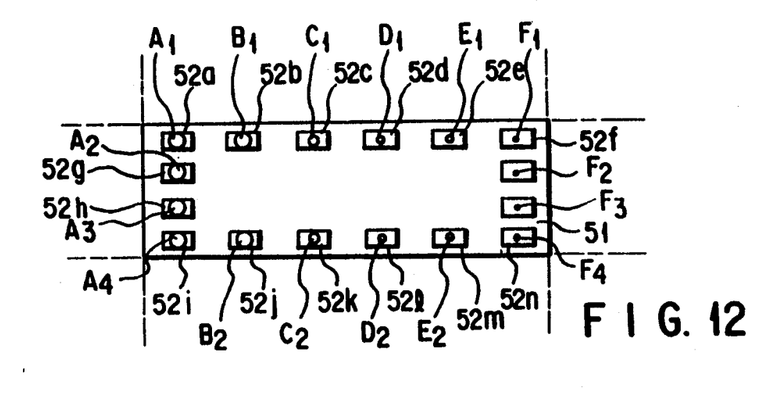
FIG. 12 is a plan view showing traces impressed by probe needles of the chip.

FIG. 11A is a block diagram for describing the embodiment of the semiconductor testing apparatus.

As is shown in FIG. 11A, a test object such as silicon wafer W is supported on an object table 71 which is movable in X-, Y-, Z- and $\theta$-directions. A multiple rectangular chip 51 comprising a number of chips is formed on the silicon wafer W (see FIG. 2). The table 71 is situated above a base 74. As is shown in FIG. 11B, servo motors 73a to 73c serving as drivers are arranged at the apices of an equilateral triangle within the base 74. By the rotation of output shafts (support legs) 73d to 73f of the servo motors 73a to 73c, a table surface 71a of the table 71 can be adjustably inclined with respect to a horizontal plane in all directions. The table 71 may be used as Z-directional driving means by equally driving the servo motors 73a to 73c. A probing card 54 driven by vertical driving means (not shown) is situated above the silicon wafer W. The probing card 54 has needles 55 with tips arranged to correspond to the electrode pattern of the chip 51, and the tips of the needles 55 come into pressured contact with the pads 52 of the chip 51 of the silicon wafer W when the wafer W is vertically moved. After the pressured contact is completed, the probing card 54 is moved, for example, upwards from the state shown in FIG. 11A and is retreated to the right side. A parallelism detector or trace reader 75 comprising an imaging device such as a CCD camera is provided above the silicon wafer W. Light emitted from a lamp 81 is reflected by the pad 52, and the trace impressed on the pad 2 by the pressured contact is read as pattern information on the basis of the reflected light.

A CPU 76 comprises an inclination judging section 76a and a parallelism control section 76b. Data (pattern) read by the trace reader 75 is converted to an electric signal and delivered to the inclination judging section 76a. A control signal is output so that the same pattern is maintained at predetermined several points on the wafer surface. On the basis of the inclination data judged by the inclination judging section 76a, the parallelism control section 76b controls motor driver units 77a to 77c, and the driver units 77a to 77c drive the servo motors 73a to 73c. Thus, the parallelism of the test object table 71 or the surface of the wafer W is adjusted. The CPU 76 is connected to a ROM 78 for storing programs for controlling the entire semiconductor testing apparatus and a RAM 79 for temporarily storing processing data. The structure of the semiconductor wafer testing apparatus is not described here since it is well known to a person skilled in the art.

The operation of the above apparatus will now be described.

The silicon wafer W is aligned and placed on a predetermined position on the table 71. In this state, the probe card 54 is moved to a lower predetermined position by the vertical driving means (not shown), and the object table 71 is moved upward for over-driving. Thus, the tips of the needles 55 are put in pressured contact with the pads 52 of chip 51. Suppose that small and large traces have been impressed by the pressured contact on the pads of selected single chip 51 of the wafer W, as shown in FIG. 12. Specifically, large traces $A_1$ to $A_4$ are formed on left-hand pads 52a, 52g, 52h and 52i of the chip 51, and traces become smaller towards the right side, like $B_1$ to $F_1$ and $B_4$ to $F_4$. From these traces, it is understood that the probing card 54 and the chip 51 are not parallel. As is shown in FIG. 5, the distance between the probing card 54 and the chip 51 is close in the left region and they are remote in the right region. This is judged by the pattern recognition technique. This state is read by the trace reader 65 as trace data on the basis of the light which is emitted from the lamp 81 and then reflected by the pads 52. The read trace data is fed to the inclination judging section 76a, and the judging section 76a judges that the probing card 54 and chip 51 are in the inclined state, as shown in FIG. 5, on the basis of the trace data. Based on the judgment data, the parallelism control section 76b performs arithmetic operations to make the probing card 54 and chip 51 parallel to each other and to move them relative to each other. For example, the parallelism of the wafer W is adjusted. The arithmetic operation results are fed to the servo motors 63a to 63c via the motor driver units 67a to 67c as parallelism control signals Ha to Hc. In accordance with the control signals Ha to Hc, the servo motors 63a to 63c are rotated forwardly and backwardly. Thus, the inclination of the table 1 is adjusted, and the probing card 54 and chip 51 are made to be parallel to each other. In this parallel state, predetermined test signals are applied by a circuit tester (not shown) and it is judged whether the circuit construction of the chip meets the design specifications.

In the present embodiment, the traces impressed by the tips of the probing card on the pads of the chip are detected by the parallelism detection means. However, it is possible, for example, to provide ultrasonic sensors on both sides of the object table, emit ultrasonic waves from the sensors to the silicon wafer, and have the waves reflected by the wafer. Thereby, the distance between the object table and the silicon wafer is measured and predetermined calculations are performed to find the parallelism. In the above embodiment, the trace reader is used as parallelism detector, but any other means capable of detecting the parallelism of the probe card may be used. For example, the parallelism may be detected electronically or on the basis of a capacitance distribution.

What is claimed is:

1. A probe apparatus comprising:
   a test head for electrically testing a test object;

a probe card having a plurality of probe needles electrically connected to said test head;
means for supporting the test object such that the test object faces the probe card and the probe needles extend toward the test object;
means for detecting an inclined state of the probe card with respect to a plane and outputting a signal corresponding to the inclined state;
said detecting means including:
imaging means for detecting the relative heights at two mutually distant points of the probe card on the basis of auto-focus adjustment amount at this time and outputting height signals corresponding to these heights,
distance signal outputting means for outputting distance signals corresponding to the distance between the two points of said probe card, and
calculation means for calculating the inclined state of the probe card with respect to a plane and outputting the calculation result; and
means for driving said support means on the basis of the output signal from said detection means, such that the test object supported by said support means is parallel to the probe card.

2. The probe apparatus according to claim 1, wherein:
said imaging means detects the relative heights at two mutually distant points in a first direction of the probe card from one plane and the heights at two mutually distant points in a second direction perpendicular to said first direction and outputting height signals corresponding to these heights; and
said distance signal outputting means outputs said distance signals corresponding to the distance between the two points in each of said first and second directions.

3. The probe apparatus according to claim 2, wherein said imaging means comprises two pairs of target marks formed on one surface of the probe card to indicate two pairs of mutually distant points in said first and second directions, said imaging means is provided on said supporting means and images said target marks for detecting the heights at the target marks on the basis of auto-focus adjustment amount at this time, and outputting corresponding electric signals as said height signals, and
said distance signal outputting means includes means for moving said support means in said first and second directions, and outputting electric signals, which correspond to the distance between each pair of target marks, as said distance signals on the basis of the amount of movement of said support means.

4. The probe apparatus according to claim 3, wherein said imaging means includes a CCD camera.

5. The probe according to claim 1, wherein said driving means comprises three support leg members for supporting said supporting means at three points with variable support lengths, and means for selectively varying the lengths of said three support leg members in accordance with the output signal from said detecting means, thereby driving the supporting means.

6. The probe apparatus according to claim 5, wherein said driving means includes a movable table which is movable in X-, Y-, Z- and $\theta$-directions, and said support leg members have first end portions supported by said table and second end portions connected to said supporting means.

7. The probe apparatus according to claim 6, wherein each of said support leg members has ball screw means for varying its own length.

8. The probe apparatus according to claim 6, wherein each of said support leg members has piezoelectric means for varying its own length.

9. The probe apparatus according to claim 1, wherein said detecting means includes means for detecting the inclined state of the probe card with respect to a plane, on the basis of the position of the probe needles relative to the test object.

10. The probe apparatus according to claim 9, wherein said detecting means includes an imaging device for imaging a contact state distribution of contact traces impressed on the test object by the probe needles and outputting a signal corresponding to the imaged contact state distribution, means for calculating the inclined state of the probe card with respect to the plane on the basis of the output signal from said imaging device and outputting a corresponding calculation result signal, and means for effecting the driving of the support means on the basis of the calculation result signal.

11. The probe apparatus according to claim 10, wherein said means for effecting the driving comprises three support leg members for supporting said supporting means at three points with variable support lengths, and means for selectively varying the lengths of said three support leg members on the basis of the calculation result signal form said calculating means.

12. The probe apparatus according to claim 11, wherein each of said support leg members includes a screw rod which is rotated to vary its own length, and said length-varying means have motors each connected to the screw rod to rotate the screw rod.

13. The probe apparatus according to claim 1, said probe card is fixed to the test head.

14. A probe apparatus comprising:
a test head for electrically testing a test object;
a probe card attached to the lower surface of said test head and having a plurality of probe needles electrically connected to said test head, the probe needles being arranged in at least one row and extending downwards;
means for horizontally supporting said test object such that the test object faces the probe card upward;
an XY table provided below said support means;
inclining means, provided between the supporting means and the XY table, for inclining the supporting means to vary the angle of inclination of the supporting means with respect to a horizontal plane, said inclining means having an upper part for supporting the supporting means and a lower part connected to the XY table; and
means for detecting an inclined state of the probe card with respect to horizontal plane,
said detecting means including:
imaging means for detecting a relative height at two mutually distant points in an X-direction and the heights at two mutually distant points in a Y-direction perpendicular to the X-direction, on the basis of auto-focus adjustment amount at their time, and outputting height signals corresponding to these heights,
distance signal outputting means for outputting distance signals corresponding to the distance between the two points in each of said directions, and calculation means for calculating the inclined state of the probe card with respect to a plane and outputting a calculation result; and means for driving the XY table on the basis of the output signal from said detecting means, such that the test object supported by the XY table is parallel to the probe card.

15. The probe apparatus according to claim 14, wherein said inclining means includes three support leg members for supporting said supporting means at three points with variable support lengths, each support leg member extending vertically.

16. The probe apparatus according to claim 15, wherein said three points are the apices of an equilateral triangle.

* * * * *